US012559858B2

(12) United States Patent
Wang et al.

(10) Patent No.: US 12,559,858 B2
(45) Date of Patent: Feb. 24, 2026

(54) CRYSTAL ROD MANUFACTURING METHOD AND CRYSTAL ROD

(71) Applicant: TCL ZHONGHUAN RENEWABLE ENERGY TECHNOLOGY CO., LTD., Tianjin (CN)

(72) Inventors: Lin Wang, Tianjin (CN); Wenxia Zhang, Tianjin (CN); Xuebing Kang, Tianjin (CN); Qian Guo, Tianjin (CN)

(73) Assignee: TCL ZHONGHUAN RENEWABLE ENERGY TECHNOLOGY CO., LTD., Tianjin (CN)

( * ) Notice: Subject to any disclaimer, the term of this patent is extended or adjusted under 35 U.S.C. 154(b) by 270 days.

(21) Appl. No.: 18/555,497

(22) PCT Filed: Sep. 4, 2023

(86) PCT No.: PCT/CN2023/116752
§ 371 (c)(1),
(2) Date: Oct. 13, 2023

(87) PCT Pub. No.: WO2025/050246
PCT Pub. Date: Mar. 13, 2025

(65) Prior Publication Data
US 2025/0092562 A1 Mar. 20, 2025

(51) Int. Cl.
C30B 15/22 (2006.01)
C30B 29/06 (2006.01)

(52) U.S. Cl.
CPC .............. C30B 15/22 (2013.01); C30B 29/06 (2013.01)

(58) Field of Classification Search
CPC ......... C30B 15/02; C30B 15/20; C30B 15/22; Y10T 117/1032
See application file for complete search history.

(56) References Cited

FOREIGN PATENT DOCUMENTS

| | | |
|---|---|---|
| CN | 101435105 A | 5/2009 |
| CN | 101514485 A | 8/2009 |

(Continued)

OTHER PUBLICATIONS

International Search Report in International application No. PCT/CN2023/116752,mailed on May 21, 2024.

(Continued)

*Primary Examiner* — Robert M Kunemund
(74) *Attorney, Agent, or Firm* — PV IP PC; Wei Te Chung

(57) ABSTRACT

The present application discloses a crystal rod manufacturing method and a crystal rod belonging to a field of monocrystal growth technologies. The crystal rod manufacturing method of the present application includes a shoulder rotation step and a diameter equalization step, wherein in the shoulder rotation step and/or the diameter equalization step, hydrogen-containing gas is inputted. The hydrogen-containing gas includes hydrogen gas, a mass of the hydrogen gas is $m_H$, a total mass of the hydrogen-containing gas is $m_{total}$, an inequation as follows is satisfied: $m_H/m_{total} \leq 30\%$. The present application, by inputting the hydrogen gas during the process of manufacturing the crystal rods, can lower an oxygen content of monocrystals to reduce defects in the monocrystalline silicon, which can reduce formation of boron oxygen complexes and prevent a phenomenon of efficiency degradation when boron-doping monocrystals are pulled.

20 Claims, 1 Drawing Sheet

(56)    References Cited

FOREIGN PATENT DOCUMENTS

| CN | 101560693 | A | | 10/2009 | | |
|----|-----------|----|----|---------|---|---|
| CN | 105019017 | A | | 11/2015 | | |
| CN | 111996594 | A | | 11/2020 | | |
| CN | 112144117 | A | | 12/2020 | | |
| DE | 102007049666 | A1 | * | 4/2000 | ......... | H01L 21/3223 |
| JP | 2007022864 | A | | 2/2007 | | |
| JP | 4750916 | B2 | * | 8/2011 | | |
| WO | WO-2004083496 | A1 | * | 9/2004 | ........... | C30B 15/203 |

OTHER PUBLICATIONS

Written Opinion of the International Search Authority in International application No. PCT/CN2023/116752,mailed on May 21, 2024.

* cited by examiner

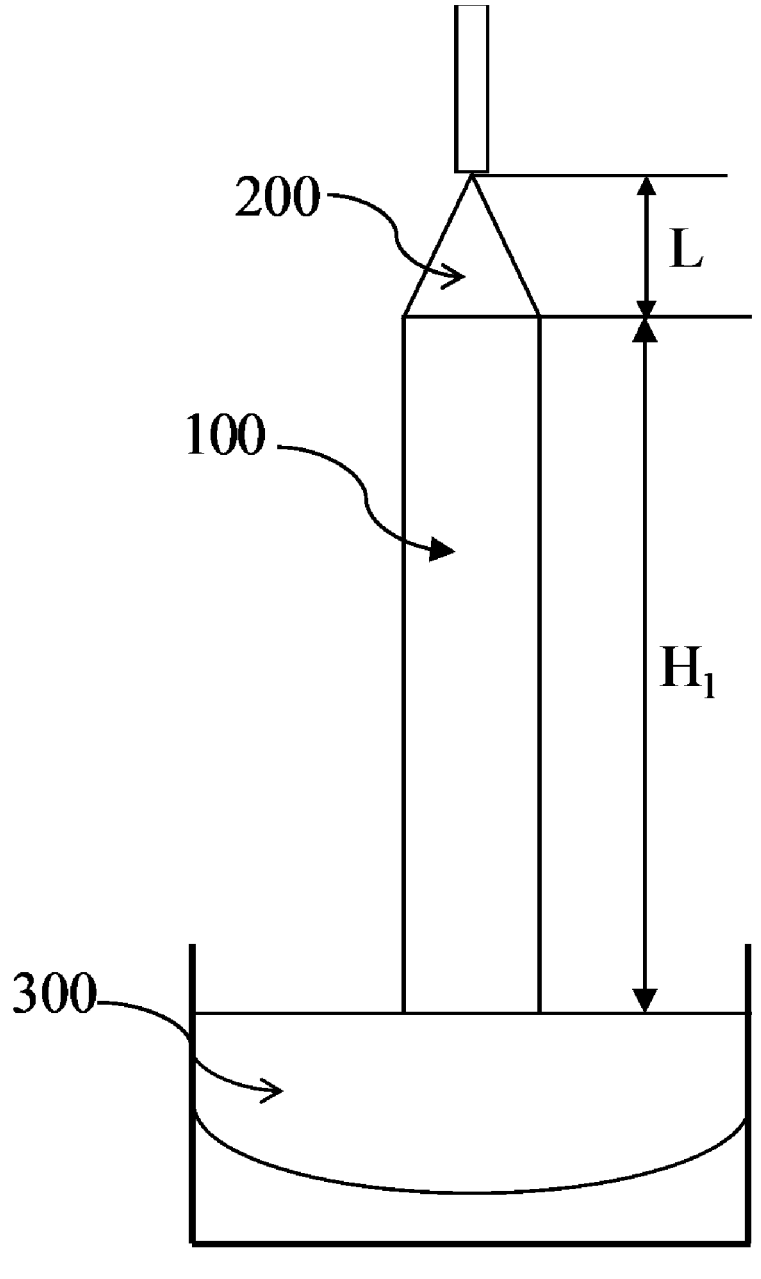

CRYSTAL ROD MANUFACTURING METHOD AND CRYSTAL ROD

CROSS REFERENCE TO RELATED APPLICATIONS

This application claims the priority of International Application No. PCT/CN2023/116752, filed on Sep. 4, 2023. The entire disclosures of the above application are incorporated herein by reference.

FIELD OF INVENTION

The present application belongs to a field of monocrystal growth technologies, especially relates to a crystal rod manufacturing method and a crystal rod.

BACKGROUND OF INVENTION

Characteristics of direct-pull single-crystal silicon products include oxygen content, minority carrier lifetime, carbon content, resistivity, defects, dislocations, etc. Excessive oxygen content in the head or low lifetime at the tail of monocrystalline silicon products would influence product quality.

Technical Issue

A main source of oxygen impurities in monocrystalline silicon is the reaction of quartz crucibles with silicon raw materials, leading to the incorporation of SiO. Oxygen elements to some extent enhance the mechanical strength of silicon wafers. However, during the later stages of production, the precipitation of a large number of oxygen impurities (>16 ppma) can cause silicon wafer warping, leading to a significant occurrence of secondary defects. This, in turn, partly affects the performance of the cells, contributing to a certain level of degradation.

Technical Solution

The embodiment of the present application provides a crystal rod manufacturing method, comprising a shoulder rotation step and a diameter equalization step, wherein during the shoulder rotation step and/or the diameter equalization step, hydrogen-containing gas is inputted, the hydrogen-containing gas comprises hydrogen gas, a mass of the hydrogen gas is $m_H$, a total mass of the hydrogen-containing gas is $m_{total}$, and an inequation as follows is satisfied: $m_H/m_{total} \leq 30\%$.

In some embodiments, the crystal rod manufacturing method further comprises a material melting step, a fusion step, a crystal seeding step, and a shoulder expansion step; and the hydrogen-containing gas is inputted in one or more of the material melting step, the fusion step, the crystal seeding step, and the shoulder expansion step.

In some embodiments, the shoulder expansion step comprises expanding and growing a shoulder to a target shoulder length stage; and in the shoulder expansion step, a shoulder length is $L_1$, a target shoulder length is L; in a stage of $0 < L_1 \leq 0.3L$, a first crucible rotational speed $V_1$ is controlled; in a stage of $0.3L < L_1 \leq L$, a second crucible rotational speed $V_2$ is controlled; and an inequation as follows is satisfied: $V_1 > V_2$.

In some embodiments, the first crucible rotational speed $V_1$ ranges from 9 r/min (revolution per minute, RPM) to 15 r/min.

In some embodiments, the second crucible rotational speed $V_2$ ranges from 7 r/min to 12 r/min.

In some embodiments, in the shoulder expansion step, a shoulder length is $L_1$, a target shoulder length is L; in a stage of $0 < L_1 \leq 0.3L$, a time period for inputting the hydrogen-containing gas is $T_1$; in a stage of $0.3 < L_1 \leq 0.6L$, a time period for inputting the hydrogen-containing gas is $T_2$; in a stage of $0.6L < L_1 \leq L$, a time period for inputting the hydrogen-containing gas is $T_3$, in the shoulder expansion step, a total time period for inputting the hydrogen-containing gas is $T_{shoulder\ expansion}$, and $T_{shoulder\ expansion} = T_1 + T_2 + T_3$; an inequation as follows is satisfied: $T_2 < T_1$.

In some embodiments, an inequation as follows is satisfied: $T_2 < T_3$.

In some embodiments, an inequation as follows is satisfied: $T_3 < T_1$.

In some embodiments, in the diameter equalization step, in a stage of $0 < H_1 \leq 0.11H$, a third crucible rotational speed $V_3$ is controlled; in a stage of $0.11H < H_1 \leq SH$, a fourth crucible rotational speed $V_4$ is controlled, an inequation as follows is satisfied: $V_3 > V_4$, $H_1$ is a crystal pulling length, and H is a target crystal rod total length.

In some embodiments, the diameter equalization step comprises a first diameter equalization stage, the first diameter equalization stage is: $0 < H_1 \leq 0.11H$, the hydrogen-containing gas is inputted in the first diameter equalization stage, $H_1$ is a crystal pulling length, and H is a target crystal rod total length.

In some embodiments, the diameter equalization step comprises a second diameter equalization stage, a third diameter equalization stage, and a fourth diameter equalization stage; the second diameter equalization stage is a stage of $0.11H < H_1 \leq 0.33H$; the third diameter equalization stage is a stage of $0.33H < H_1 \leq 0.77H$, the fourth diameter equalization stage is a stage of $0.77 < H_1 \leq H$; and the hydrogen-containing gas is inputted in one or more of the second diameter equalization stage, the third diameter equalization stage, and the fourth diameter equalization stage.

In some embodiments, in the first diameter equalization stage a time period for inputting the hydrogen-containing gas is $T_4$, in the second diameter equalization stage a time period for inputting the hydrogen-containing gas is $T_5$, in the third diameter equalization stage a time period for inputting the hydrogen-containing gas is $T_6$, in the fourth diameter equalization stage a time period for inputting the hydrogen-containing gas is $T_7$; and an inequation as follows is satisfied: $T_4 < T_5 = T_7 < T_6$.

In some embodiments, a hydrogen content of the hydrogen-containing gas in the first diameter equalization stage is greater than a hydrogen content of the hydrogen-containing gas in each of the second diameter equalization stage, the third diameter equalization stage, and the fourth diameter equalization stage.

In some embodiments, the material melting step comprises a feeding step, a re-feeding step, and a volatilization step, and a temperature of the feeding step ranges from 300° C. to 1600° C.

In some embodiments, a temperature of the re-feeding step ranges from 1400° C. to 1600° C.

In some embodiments, a temperature of the volatilization step ranges from 1460° C. to 1480° C.

In some embodiments, a time period for the feeding step ranges from 4 hours to 12 hours.

In some embodiments, a time period for the re-feeding step ranges from 3 hours to 10 hours.

In some embodiments, a time period for the volatilization step ranges from 0.3 hours to 3 hours.

In some embodiments, the hydrogen-containing gas is inputted in the material melting step, and a hydrogen content of the hydrogen-containing gas is ≤30%.

In some embodiments, the hydrogen-containing gas is inputted in the feeding step, and a hydrogen content of the hydrogen-containing gas is ≤30%.

In some embodiments, the hydrogen-containing gas is inputted in the re-feeding step, and a hydrogen content of the hydrogen-containing gas is ≤20%; and the hydrogen-containing gas is inputted in the volatilization step, and a hydrogen content of the hydrogen-containing gas is ≤20%.

In some embodiments, the fusion step comprises a high temperature preheating stage and a low temperature fusion stage.

In some embodiments, a temperature of the high temperature preheating stage ranges from 1457° C. to 1475° C.

In some embodiments, a temperature of the low temperature fusion stage ranges from 1449° C. to 1457° C.)

In some embodiments, a crucible rotational speed of the fusion step ranges from 6 r/min to 15 r/min.

In some embodiments, a duration of the high temperature preheating stage ranges from 0.1 hours to 1 hour.

In some embodiments, a duration of the low temperature fusion stage ranges from 0.1 hours to 4 hours.

In some embodiments, the hydrogen-containing gas is inputted in the fusion step, and a hydrogen content of the hydrogen-containing gas is ≤15%.

In some embodiments, a content of boron and/or gallium in raw material for manufacturing the crystal rod ranges from 0.007 milligrams per gram (mg/g) to 0.8 mg/g.

In some embodiments, a content of phosphorus in raw material for manufacturing the crystal rod ranges from 0.001 mg/g to 0.01 mg/g.

The present application provides a crystal rod, and the crystal rod is obtained from the crystal rod manufacturing method.

The embodiment of the present application also provides a crystal rod manufacturing method, comprising: a shoulder rotation step and a diameter equalization step, wherein during the shoulder rotation step and/or the diameter equalization step, hydrogen-containing gas is inputted, the hydrogen-containing gas comprises hydrogen gas, a mass of the hydrogen gas is $m_H$, a total mass of the hydrogen-containing gas is $m_{total}$, and an inequation as follows is satisfied: $m_H/m_{total} \leq 30\%$; wherein the crystal rod manufacturing method further comprises a material melting step, a fusion step, a crystal seeding step, and a shoulder expansion step; wherein the hydrogen-containing gas is inputted in one or more of the material melting step, the fusion step, the crystal seeding step, and the shoulder expansion step; wherein in the diameter equalization step, in a stage of $0 < H_1 \leq 0.11H$, a third crucible rotational speed $V_3$ is controlled; in a stage of $0.11H < H_1 \leq H$, a fourth crucible rotational speed $V_4$ is controlled, an inequation as follows is satisfied: $V_3 > V_4$, $H_1$ is a crystal pulling length, and H is a target crystal rod total length.

In some embodiments, the shoulder expansion step comprises expanding and growing a shoulder to a target shoulder length stage; and in the shoulder expansion step, a shoulder length is $L_1$, a target shoulder length is L; in a stage of $0 < L_1 \leq 0.3L$, a first crucible rotational speed $V_1$ is controlled; in a stage of $0.3L < L_1 \leq L$, a second crucible rotational speed $V_2$ is controlled; and an inequation as follows is satisfied: $V_1 > V_2$.

In some embodiments, the first crucible rotational speed $V_1$ ranges from 9 r/min (revolution per minute, RPM) to 15 r/min; and/or, the second crucible rotational speed $V_2$ ranges from 7 r/min to 12 r/min.

In some embodiments, in the shoulder expansion step, a shoulder length is $L_1$, a target shoulder length is L; in a stage of $0 < L_1 \leq 0.3L$, a time period for inputting the hydrogen-containing gas is $T_1$; in a stage of $0.3L < L_1 \leq 0.6L$, a time period for inputting the hydrogen-containing gas is $T_2$; in a stage of $0.6L < L_1 \leq L$, a time period for inputting the hydrogen-containing gas is $T_3$; in the shoulder expansion step, a total time period for inputting the hydrogen-containing gas is $T_{shoulder\ expansion}$, and $T_{shoulder\ expansion} = T_1 + T_2 + T_3$; an inequation as follows is satisfied: $T_2 < T_1$; and/or, an inequation as follows is satisfied: $T_2 < T_3$; and/or, an inequation as follows is satisfied: $T_3 < T_1$.

In some embodiments, the diameter equalization step comprises a first diameter equalization stage, the first diameter equalization stage is: $0 < H_1 \leq 0.11H$, the hydrogen-containing gas is inputted in the first diameter equalization stage.

Advantages

The present application provides a crystal rod manufacturing method, comprising a shoulder rotation step and a diameter equalization step, wherein in the shoulder rotation step and/or the diameter equalization step, hydrogen-containing gas is inputted. The hydrogen-containing gas comprises hydrogen gas, a mass of the hydrogen gas is $m_H$, a total mass of the hydrogen-containing gas is $m_{total}$, an inequation as follows is satisfied: $m_H/m_{total} \leq 30\%$. The present application, by inputting the hydrogen gas during the process of manufacturing the crystal rods, can lower an oxygen content of monocrystals to reduce defects in the monocrystalline silicon, which can reduce formation of boron oxygen complexes and prevent a phenomenon of efficiency degradation when boron-doping monocrystals are pulled.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may also acquire other figures according to the appended figures without any creative effort.

FIG. 1 is a schematic structural view of manufacturing crystal rods in the embodiment of the present application;

DESCRIPTION FOR THE ATTACHED DRAWINGS

100 crystal rod, 200 shoulder, 300 crucible.

DETAILED DESCRIPTION OF PREFERRED EMBODIMENTS

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application. In addition, in the description of the present application, the term "comprising" is understood to mean "comprising but not limited to." The use of terms like "first," "second," "third," and so on is for labeling purposes only and does not impose numerical requirements or establish an order. Various embodiments of the present application can exist in the form of a range. It should be understood that describing in range form is merely for convenience and conciseness and should not be construed as a strict limitation on the range of the present application. Therefore, the range description should be considered as disclosing all possible sub-ranges within that range and individual values within that range. For example, it should be considered that a range description from 1 to 6 has specifically disclosed sub-ranges, such as from 1 to 3, from 1 to 4, from 1 to 5, from 2 to 4, from 2 to 6, from 3 to 6, and so on, as well as individual numbers within the range, such as 1, 2, 3, 4, 5, and 6, regardless of the specific range being referred to. Furthermore, whenever a numerical range is mentioned in this document, it includes any references to numbers within that range (whether fractions or integers).

A main source of oxygen impurities in monocrystalline silicon is the reaction of quartz crucibles with silicon raw materials, leading to the incorporation of SiO. Under a high temperature of 1400° C., a silicon melt and a quartz crucible undergo a chemical reaction:

$$Si+SiO_2 \rightarrow 2SiO \quad SiO+Si \rightarrow O$$

In the high temperature, the majority of SiO is volatilized from a free surface of the melt, and after SiO decomposes at the leading edge of the solid-liquid interface in the boundary layer, oxygen atoms enter the crystal rod through a segregation phenomenon.

Due to the presence of a certain amount of oxygen in silicon, it enhances the mechanical strength of silicon wafers to some extent. During the later processing stages, subjecting silicon to high temperatures can cause oxygen to precipitate, along with corresponding defects. This can help reduce dispersed current carrier recombination centers, improving the efficiency and photoelectric conversion efficiency of solar batteries. However, if a large amount of oxygen impurity precipitates (>16 ppma) during the later stages of production, it can lead to silicon wafer warping and also result in a significant number of secondary defects. This, in turn, can partially impact the performance of the battery, causing a certain level of degradation.

The present application replaces the original monocrystal growth process, where argon gas is inputted into the furnace, with the introduction of hydrogen-containing gas. This substitution can reduce the oxygen content in the monocrystal and consequently reduce internal defects in monocrystalline silicon. In some embodiments, present application provides a crystal rod manufacturing method, comprising a shoulder rotation step and a diameter equalization step, wherein in the shoulder rotation step and/or the diameter equalization step, hydrogen-containing gas is inputted. The hydrogen-containing gas comprises hydrogen gas, a mass of the hydrogen gas is $m_H$, a total mass of the hydrogen-containing gas is $m_{total}$, an inequation as follows is satisfied: $m_H/m_{total} \leq 30\%$.

In some embodiments, the hydrogen-containing gas is a gas mixture of hydrogen gas and argon gas.

In some embodiments, the hydrogen-containing gas is a gas mixture of hydrogen gas and nitrogen gas.

In the present application, hydrogen gas is inputted as a protective gas during the process of pulling silicon monocrystals. The silicon crystal is placed inside a vacuum heating furnace, and during the heat treatment process of the silicon crystal, the protective gas is inputted into the vacuum heating furnace and flows over the surface of the silicon crystal. The protective gas used in the present application is a gas containing hydrogen atoms and is mixed with inert gases. When the silicon crystal is subjected to heat treatment using the method described in the present application, hydrogen plays a role in passivating impurities and defects within the silicon crystal and also facilitates doping. As a result, the minority carrier lifetime of the silicon crystal significantly increases. Additionally, it adjusts the radial and axial resistivity distribution uniformity of the silicon crystal, making the resistivity of the silicon crystal more uniform in both the crystal's radial and longitudinal directions. The method described in the present application is simple to operate, suitable for industrial production, and significantly enhances the quality of the product.

In some embodiments, based on a total mass of the hydrogen-containing gas, a mass percentage (%) of hydrogen gas in the hydrogen-containing gas is any one of 5, 10, 15, 20, 25, 30 or is within a range defined by any two of the values.

In some embodiments, during the process of manufacturing the crystal rods, the argon gas or the hydrogen-containing gas are inputted, and a flow of the inputted gas ranges from 20 standard liter per minute (slpm) to 220 slpm.

In some embodiments, the inputted gas flow (slpm) is any one of 20, 30, 40, 50, 60, 70, 80, 90, 100, 110, 120, 130, 140, 150, 160, 170, 180, 190, 200, 210, 220, or is within a range defined by any two of the values.

In some embodiments, the method for manufacturing the crystal rod further comprises a material melting step, a fusion step, a crystal seeding step, and a shoulder expansion step, and the hydrogen-containing gas is inputted in one or more of the material melting step, the fusion step, the crystal seeding step, and the shoulder expansion step.

In some embodiments, the shoulder expansion step comprises expanding and growing a shoulder to a target shoulder length stage, as shown in FIG. 1, during the shoulder expansion, a shoulder length is $L_1$, a target shoulder length is L; in a stage of $0 < L_1 \leq 0.3L$, a first crucible rotational speed $V_1$ is controlled; in a stage of $0.3L < L_1 \leq L$, a second crucible rotational speed $V_2$ is controlled; and an inequation as follows is satisfied: $V_1 > V_2$.

In some embodiments, the first crucible rotational speed $V_1$ ranges from 9 r/min (revolution per minute, RPM) to 15 r/min. For example, a value of the first crucible rotational speed $V_1$ (r/min) is any one of 9, 10, 11, 12, 13, 14, 15 or within a range defined by any two of the values.

In some embodiments, the second crucible rotational speed $V_2$ ranges from 7 r/min to 12 r/min, a value of second crucible rotational speed $V_2$ (r/min) is any one of 7, 8, 9, 10, 11, 12 or is within a range defined by any two of the values.

In some embodiments, in the shoulder expansion step, during the shoulder expansion, a shoulder length is $L_1$, a target shoulder length is L; wherein in a $0 < L_1 \leq 0.3L$ stage, a time period for inputting the hydrogen-containing gas is $T_1$; in a stage of $0.3L < L_1 \leq 0.6L$, a time period for inputting the hydrogen-containing gas is $T_2$; and in a stage of $0.6L < L_1 \leq L$, a time period for inputting the hydrogen-containing gas is $T_3$; in the shoulder expansion step, a total time period for inputting hydrogen-containing gas is $T_{shoulder\ expansion}$, and $T_{shoulder\ expansion} = T_1 + T_2 + T_3$, and an inequation as follows is satisfied: $T_2 < T_1$.

In some embodiments, an inequation as follows is satisfied: $T_2 < T_3$.

In some embodiments, an inequation as follows is satisfied: $T_3 < T_1$.

In some embodiments, $T_1$ ranges from 0.6 hours (h) to 1.8 hours, for example, $T_1$ (h) is any one of 0.6, 0.7, 0.8, 0.9, 1.0, 1.1, 1.2, 1.3, 1.4, 1.5, 1.6, 1.7, 1.8 or is within a range defined by any two of the values.

In some embodiments, $T_2$ ranges from 0.3 hours to 1.5 hours, for example, a value of $T_2$ (h) is any one of 0.3, 0.4, 0.5, 0.6, 0.7, 0.8, 0.9, 1.0, 1.1, 1.2, 1.3, 1.4, 1.5 or is within a range defined by any two of the values.

In some embodiments, $T_3$ ranges from 0.5 hours to 1.6 hours, for example, a value of $T_3$ (h) is any one of 0.5, 0.6, 0.7, 0.8, 0.9, 1.0, 1.1, 1.2, 1.3, 1.4, 1.5, 1.6 or is within a range defined by any two of the values.

In some embodiments, in the stage of $0 < L_1 \leq 0.3L$, a content of the hydrogen gas in the hydrogen-containing gas is $\leq 15\%$, for example, a value of a content (%) of the hydrogen gas in the hydrogen-containing gas is any one of 5, 10, 15 or is within a range defined by any two of the values.

In some embodiments, in a stage of $0.3L < L_1 \leq 0.6L$, a content of the hydrogen gas in the hydrogen-containing gas is $\leq 15\%$, for example, a value of a content (%) of the hydrogen gas in the hydrogen-containing gas is any one of 5, 10, 15 or is within a range defined by any two of the values.

In some embodiments, in a stage of $0.6L < L_1 \leq L$, a content of the hydrogen gas in the hydrogen-containing gas is $\leq 15\%$, for example, a value of a content (%) of the hydrogen gas in the hydrogen-containing gas is any one of 5, 10, 15 or is within a range defined by any two of the values.

In some embodiments, in the diameter equalization step, in a stage of $0 < H_1 \leq 0.11H$, a third crucible rotational speed $V_3$ is controlled; in a stage of $0.11H < H_1 \leq H$, a fourth crucible rotational speed $V_4$ is controlled, and an inequation as follows is satisfied: $V_3 > V_4$, wherein $H_1$ is a crystal pulling length, and H is a target crystal rod total length.

With reference to FIG. 1, during the crystal growth process, a crystal pulling length $H_1$ is a length from a liquid level of a crucible to a top end of the crystal rod. The target crystal rod total length H is a total length of the crystal rod after crystal growth is completed.

In some embodiments, the third crucible rotational speed $V_3$ ranges from 7 r/min to 12 r/min, and a value of the third crucible rotational speed $V_3$ (r/min) is any one of 7, 8, 9, 10, 11, 12 or is within a range defined by any two of the values.

In some embodiments, the fourth crucible rotational speed $V_4$ ranges from 6 r/min-10 r/min, and a value of the fourth crucible rotational speed $V_4$ (r/min) is any one of 6, 7, 8, 9, 10 or is within a range defined by any two of the values.

In some embodiments, the diameter equalization step comprises a first diameter equalization stage, and the first diameter equalization stage is: $0 < H_1 \leq 0.11H$. The hydrogen-containing gas is inputted in the first diameter equalization stage, and $H_1$ is a crystal pulling length, H is a target crystal rod total length.

In some embodiments, the diameter equalization step comprises a second diameter equalization stage, a third diameter equalization stage, and a fourth diameter equalization stage. The second diameter equalization stage is a stage of $0.11H < H_1 \leq 0.33H$. The third diameter equalization stage is a stage of $0.33H < H_1 \leq 0.77H$. The fourth diameter equalization stage is a stage of $0.77H < H_1 \leq H$. The hydrogen-containing gas is inputted in any one or more of the second diameter equalization stage, the third diameter equalization stage, and the fourth diameter equalization stage.

In some embodiments, in the first diameter equalization stage, a time period for inputting the hydrogen-containing gas is $T_4$. In the second diameter equalization stage, a time period for inputting the hydrogen-containing gas is $T_5$. In the third diameter equalization stage, a time period for inputting the hydrogen-containing gas is $T_6$. In the fourth diameter equalization stage, a time period for inputting the hydrogen-containing gas is $T_7$.

In some embodiments, the hydrogen-containing gas is inputted in each of the first diameter equalization stage, the second diameter equalization stage, the third diameter equalization stage, and the fourth diameter equalization stage.

In some embodiments, a value of $T_4$ ranges from 5 hours to 9 hours, for example, a value of $T_4$ (h) is any one of 5, 6, 7, 8, 9 or is within a range defined by any two of the values.

In some embodiments, a value of $T_5$ ranges from 8 hours to 16 hours, for example, a value of $T_5$ (h) is any one of 8, 9, 10, 11, 12, 13, 14, 15, 16 or is within a range defined by any two of the values.

In some embodiments, a value of $T_6$ ranges from 16 hours to 24 hours, for example, a value of $T_6$ (h) is any one of 16, 17, 18, 19, 20, 21, 22, 23, 24 or is within a range defined by any two of the values.

In some embodiments, a value of $T_7$ ranges from 9 hours to 15 hours, for example, a value of $T_7$ (h) is any one of 9, 10, 11, 12, 13, 14, 15 or is within a range defined by any two of the values.

In some embodiments, an inequation as follows is satisfied: $T_4 < T_5 = T_7 < T_6$.

In some embodiments, in the first diameter equalization stage, a content of the hydrogen gas in the hydrogen-containing gas inputted is $\leq 15\%$, for example, in the first diameter equalization stage, a value of a content (%) of the hydrogen gas in the hydrogen-containing gas inputted is any one of 0, 1, 2, 3, 4, 5, 6, 7, 8, 9, 10, 11, 12, 13, 14, 15 or is within a range defined by any two of the values.

In some embodiments, in the second diameter equalization stage, a content of the hydrogen gas in the hydrogen-containing gas inputted is $\leq 10\%$, for example, in the second diameter equalization stage, a value of a content (%) of the hydrogen gas in the hydrogen-containing gas inputted is any one of 0, 1, 2, 3, 4, 5, 6, 7, 8, 9, 10 or is within a range defined by any two of the values.

In some embodiments, in the third diameter equalization stage, a content of the hydrogen gas in the hydrogen-containing gas inputted is $\leq 10\%$, for example, in the third diameter equalization stage, a value of a content (%) of the hydrogen gas in the hydrogen-containing gas inputted is any one of 0, 1, 2, 3, 4, 5, 6, 7, 8, 9, 10 or is within a range defined by any two of the values.

In some embodiments, fourth diameter equalization stage a content of the hydrogen gas in the hydrogen-containing gas inputted is $\leq 10\%$, for example, in the fourth diameter equalization stage, a value of a content (%) of the hydrogen gas in the hydrogen-containing gas inputted is any one of 0, 1, 2, 3, 4, 5, 6, 7, 8, 9, 10 or is within a range defined by any two of the values.

In some embodiments, a hydrogen content of the hydrogen-containing gas in the first diameter equalization stage is greater than a hydrogen content of the hydrogen-containing gas in each of the second diameter equalization stage, the third diameter equalization stage, and the fourth diameter equalization stage.

In some embodiments, in the present application, a hydrogen content refers to a mass percentage of the hydrogen gas in the hydrogen-containing gas.

In some embodiments, material melting step comprises a feeding step, a re-feeding step, and a volatilization step, feeding temperature ranges from 300° C. to 1600° C., for example, a value of the feeding temperature (° C.) is any one of 300, 400, 500, 600, 700, 800, 900, 1000, 1100, 1200, 1300, 1400, 1500, 1600 or is within a range defined by any two of the values.

In some embodiments, re-feeding temperature ranges from 1400° C. to 1600° C., for example, a value of the re-feeding temperature (C) is any one of 1400, 1450, 1500, 1550, 1600 or is within a range defined by any two of the values.

In some embodiments, a volatilization temperature ranges from 1460° C. to 1480° C., for example, a value of the volatilization temperature (° C.) is any one of 1460, 1470, 1480° c. or is within a range defined by any two of the values.

In some embodiments, feeding time ranges from 4 hours to 12 hours, for example, a value of the feeding time (h) is any one of 4, 5, 6, 7, 8, 9, 10, 11, 12 or is within a range defined by any two of the values.

In some embodiments, re-feeding time ranges from 3 hours to 10 hours, for example, a value of the re-feeding time (h) is any one of 3, 4, 5, 6, 7, 8, 9, 10 or is within a range defined by any two of the values.

In some embodiments, a volatilization time ranges from 0.3 hours to 3 hours, for example, a value of the volatilization time (h) is any one of 0.3, 0.5, 1, 1.5, 2, 2.5, 3 or is within a range defined by any two of the values.

In some embodiments, in the material melting step, the hydrogen-containing gas is inputted, a content of the hydrogen gas in the hydrogen-containing gas is ≤30%, for example, a value of a content of the hydrogen gas (%) is any one of 0, 5, 10, 15, 20, 25, 30 or is within a range defined by any two of the values.

In some embodiments, in the feeding step, a content of the hydrogen gas in the hydrogen-containing gas inputted is ≤30%, for example, a value of a content of the hydrogen gas (%) is any one of 0, 5, 10, 15, 20, 25, 30 or is within a range defined by any two of the values.

In some embodiments, the re-feeding step, a content of the hydrogen gas (%) in the hydrogen-containing gas inputted is ≤20%, for example, a value of a content of the hydrogen gas (%) is any one of 0, 5, 10, 15, 20 or is within a range defined by any two of the values.

In some embodiments, volatilization step, a content of the hydrogen gas in the hydrogen-containing gas inputted is ≤20%, for example, a value of a content of the hydrogen gas (%) is any one of 0, 5, 10, 15, 20 or is within a range defined by any two of the values.

In some embodiments, the fusion step comprises a high temperature preheating stage and a low temperature fusion stage.

In some embodiments, the high temperature preheating stage temperature ranges from 1457° C. to 1475° C., for example, a value of the high temperature preheating stage temperature (C) is any one of 1457, 1460, 1465, 1470, 1475 or is within a range defined by any two of the values.

In some embodiments, the low temperature fusion stage temperature ranges from 1449° C. to 1457° C., for example, a value of the low temperature fusion stage temperature (C) is any one of 1449, 1450, 1451, 1452, 1453, 1454, 1455, 1456, 1457 or is within a range defined by any two of the values.

In some embodiments, a crucible rotational speed of the fusion step ranges from 9 r/min-15 r/min, for example, a value of the crucible rotational speed (r/min) is any one of 9, 10, 11, 12, 13, 14, 15 or is within a range defined by any two of the values.

In some embodiments, a duration of the high temperature preheating stage ranges from 0.1 hours to 1 hour, for example, a value of a duration of the high temperature preheating stage (h) is any one of 0.1, 0.2, 0.3, 0.4, 0.5, 0.6, 0.7, 0.8, 0.9, 1.0 or is within a range defined by any two of the values.

In some embodiments, a duration of the low temperature fusion stage ranges from 0.1 hours to 4 hours, for example, a value of a duration of the low temperature fusion stage duration (h) is any one of 0.1, 0.5, 1.0, 1.5, 2.0, 2.5, 3.0, 3.5, 4.0 or is within a range defined by any two of the values.

In some embodiments, the hydrogen-containing gas is inputted in the fusion step, a hydrogen content in the hydrogen-containing gas is ≤15%, for example, a value of a hydrogen content (%) is any one of 0, 5, 10, 15 or is within a range defined by any two of the values.

In some embodiments, a content of boron and/or gallium ranges from 0.007 mg/g to 0.8 mg/g in raw material for manufacturing the crystal rod.

In some embodiments, a content of phosphorus in raw material for manufacturing the crystal rod ranges from 0.001 mg/g to 0.01 mg/g.

In some embodiments, a value of a content (mg/g) of boron in the raw material of the monocrystalline silicon is any one of 0.007, 0.01, 0.05, 0.1, 0.2, 0.3, 0.4, 0.5, 0.6, 0.7, 0.8 or is within a range defined by any two of the values.

In some embodiments, a content (mg/g) of gallium in the raw material of the monocrystalline silicon is any one of 0.007, 0.01, 0.05, 0.1, 0.2, 0.3, 0.4, 0.5, 0.6, 0.7, 0.8 or is within a range defined by any two of the values.

In some embodiments, a value of a content of phosphorus (mg/g) in monocrystalline silicon raw material is any one of 0.001, 0.005, 0.01 or is within a range defined by any two of the values.

In the present application, Resistivity is the product of electrical resistance and cross-sectional area within the crystal rod, divided by its length. It is a substance formed by the arrangement of silicon atoms. When phosphorus is doped into silicon, it becomes n-type, and the more phosphorus is added, the more free electrons are present, resulting in higher conductivity and lower resistivity. Conversely, when boron is doped into silicon, it becomes p-type, and the more boron is added, the more holes are generated, leading to increased conductivity and lower resistivity. Resistivity uniformity, which is a smaller ratio between the head and tail resistivities, is beneficial for achieving the desired quality of the crystal rod and directly impacts the conversion efficiency of solar batteries.

In the present application, boron, gallium or a content of phosphorus refers to a ratio of a mass of boron, gallium or phosphorus, gallium, or phosphorus elements to a mass of monocrystalline silicon raw material. Taking boron elements as an example, the mass of boron elements is $M_1$ mg, the mass of monocrystalline silicon raw material is $M_2$ g, and a boron content=$M_1/M_2$ mg/g.

The present application inputs hydrogen gas during the process of manufacturing the crystal rods, especially when pulling boron-doping monocrystals, which can reduce formation of boron oxygen complexes and prevent degradation of the battery cells.

Accordingly, the present application provides a crystal rod manufactured by the above manufacturing method. The present application, inputting hydrogen-containing gas during the process of manufacturing the crystal rods, can reduce the oxygen content of monocrystalline silicon to further reduce defect inside the monocrystalline silicon, improves the crystal tail resistivity and the minority carrier lifetime to further increase a pulling length of the crystal rod, reduce the overall time proportion of non-diameter equalization state, and increase production yield. Also, conversion efficiency of the solar batteries can be improved. The present application can reduce oxide generation and accumulation inside the monocrystal furnace, reducing the time and frequency required for post-furnace cleaning of oxides. This minimizes manual labor and enables the monocrystal furnace to restart production more quickly, saving time and increasing production capacity. Additionally, by carefully controlling parameters during the crystal rod manufacturing process, the present application yields high-quality monocrystalline silicon products suitable for enhancing the efficiency of downstream battery components.

Embodiment 1

Material melting: Raw material of 500 Kg is fed into a furnace, and a mass percentage thereof is composed of virgin polycrystalline silicon material of 50% and gallium-containing recycled material of 50%. The virgin polycrystalline silicon material contains boron of 0.5 mg and phosphorus of 0.1 mg. The recycled material contains boron of 5.5 mg, The crucible bottom material simultaneously contains phosphorus of 0.9 mg and doped with boron of 86 g.

The material melting is implemented by 8 hours at a temperature of 1500° C., in which the hydrogen-containing gas is inputted, and a flow of the hydrogen-containing gas is 110 slpm. In the hydrogen-containing gas, a content of the hydrogen gas is 20%, a content of argon gas is 80%, and the crucible rotational speed is 3 r/min.

Re-feeding: After the material melting, raw material of virgin polycrystalline silicon of 560 kg in the material melting step the is inputted again, a temperature is 1500° C., material melting is implemented by 7 hours, hydrogen-containing gas is inputted, and a flow of the hydrogen-containing gas is 110 slpm, hydrogen content in the hydrogen-containing gas is 10%, a content of the argon gas is 90%, and a crucible rotational speed is 6 r/min.

Volatilization: A temperature is controlled to 1470° C., volatilization is implemented by 2 hours, hydrogen-containing gas is inputted, and a flow of the hydrogen-containing gas is 110 slpm. In the hydrogen-containing gas, a content of the hydrogen gas is 10%, a content of the argon gas is 90%, and a crucible rotational speed is 6 r/min.
Fusion:

High temperature preheating: Preheating is implemented at 1470° C. by 0.3 hours, hydrogen-containing gas is inputted, and a flow of the hydrogen-containing gas is 100 slpm. In the hydrogen-containing gas, a content of the hydrogen gas is 10%, a content of the argon gas is 90%, and a crucible rotational speed is 12 r/min.

Low temperature fusion: Fusion is implemented at 1450° C. by 2 hours, hydrogen-containing gas is inputted, and a flow of the hydrogen-containing gas is 100 slpm. In the hydrogen-containing gas, a content of the hydrogen gas is 5%, a content of the argon gas is 95%, and a crucible rotational speed is 12 r/min.

Crystal seeding: Crystal seeding is maintained at a temperature of 1450° C. by 1 hour, hydrogen-containing gas is inputted, and a flow of the hydrogen-containing gas is 100 slpm. In the hydrogen-containing gas, a content of the hydrogen gas is 5%, a content of the argon gas is 95%, the crucible rotational speed is 12 r/min.

Shoulder expansion: When the shoulder length ranges from 0 mm to 75 mm, a pulling control speed is 1.4 mm/min for a time period of 1.2 hours, hydrogen-containing gas is inputted, and a flow of the hydrogen-containing gas is 100 slpm. In the hydrogen-containing gas, a content of the hydrogen gas is 5%, a content of the argon gas is 95%, and a crucible rotational speed is 12 r/min.

When the shoulder length ranges from 75 mm to 149 mm, a pulling control speed is 1.5 mm/min for a time period of 0.9 hours, hydrogen-containing gas is inputted, and a flow of the hydrogen-containing gas is 100 slpm. In the hydrogen-containing gas, a content of the hydrogen gas is 5%, a content of the argon gas is 95%, and a crucible rotational speed is 10 r/min.

When the shoulder length ranges from 150 mm to 250 mm, a pulling control speed is 1.5 mm/min for a time period of 1 hour, hydrogen-containing gas is inputted, and a flow of the hydrogen-containing gas is 100 slpm. In the hydrogen-containing gas, a content of the hydrogen gas is 5%, a content of the argon gas is 95%, and a crucible rotational speed is 10 r/min.

Shoulder rotation: During the shoulder rotation, a power of a main heater is maintained at 50 kW, a pulling control speed is 1.2 mm/min for a time period of 0.2 hours, hydrogen-containing gas is inputted, and a flow of the hydrogen-containing gas is 100 slpm. In the hydrogen-containing gas, a content of the hydrogen gas is 5%, a content of the argon gas is 95%, and a crucible rotational speed is 10 r/min.

Diameter equalization: When a crystal rod length is from 0 mm to 500 mm, a time period for the diameter equalization is 7 hours, hydrogen-containing gas is inputted, and a flow of the hydrogen-containing gas is 100 slpm. In the hydrogen-containing gas, a content of the hydrogen gas is 15%, a content of the argon gas is 85%, and a crucible rotational speed is 10 r/min, and a heating power of the heater is maintained at 46 KW.

When the crystal rod length ranges from 500 mm to 1500 mm, a time period for the diameter equalization is 12 hours, hydrogen-containing gas is inputted, and a flow of the hydrogen-containing gas is 100 slpm. In the hydrogen-containing gas, a content of the hydrogen gas is 10%, a content of the argon gas is 90%, and a crucible rotational speed is 8 r/min, and a heating power of the heater is maintained at 46 KW.

When the crystal rod length ranges from 1500 mm to 3500 mm, a time period for the diameter equalization is 20 hours, the hydrogen-containing gas is inputted, a flow is 100 slpm, a content of the hydrogen gas is 10%, a content of the argon gas is 90%, and a crucible rotational speed is 8 r/min, and a heating power of the heater is maintained at 49 KW.

When the crystal rod length ranges from 3500 mm to 4500 mm, a time period for the diameter equalization is 12 hours, hydrogen-containing gas is inputted, a flow is 100 slpm, a content of the hydrogen gas is 10%, a content of the argon gas is 90%, and a crucible rotational speed is 8 r/min, and a heating power of the heater is maintained at 49 KW.

Manufacturing parameters of embodiment 1 are as shown in Table 1.

TABLE 1

| | | | manufacturing parameters of the crystal rod of embodiment 1 | | | | |
|---|---|---|---|---|---|---|
| Time period | Stage | Parameter | Process step time value (hr) | Hydrogen-containing total flow value (slpm) | Amount of inputted hydrogen (%) | Rotational speed (r/min) |
| T11 | material melting | temperature 1500° C. | 8 | 110 | 20 | 3 |
| T12 | re-feeding | temperature 1500° C. | 7 | 110 | 10 | 6 |
| T13 | volatilization | temperature 1470° C. | 2 | 110 | 10 | 6 |
| T1 | fusion | high temperature preheating 1470° C. | 0.3 | 100 | 10 | 12 |
| T2 | | low temperature fusion 1450° C. | 2 | 100 | 5 | 12 |
| T3 | crystal seeding | 1450° C. | 1 | 100 | 5 | 12 |
| T4 | shoulder expansion | shoulder length 0-75 mm | 1.2 | 100 | 5 | 12 |
| T5 | | shoulder length 76 mm-149 mm | 0.9 | 100 | 5 | 10 |
| T6 | | shoulder length 150 mm-245 mm | 1 | 100 | 5 | 10 |
| T7 | shoulder rotation | / | 0.2 | 100 | 5 | 10 |
| T8 | diameter | 0-500 mm | 7 | 100 | 15 | 10 |
| T9 | equalization | 500 mm-1500 mm | 12 | 100 | 10 | 8 |
| T10 | | 1500 mm-3500 mm | 20 | 100 | 10 | 8 |
| T11 | | 3500 mm-4500 mm | 12 | 100 | 10 | 8 |

Embodiment 2: the manufacturing method is different from the manufacturing method of embodiment 1, the difference is that a time period for inputting the hydrogen gas is changed, and specific parameters refer to Table 2.

TABLE 2

| | | | manufacturing parameters of the crystal rod of embodiment 2 | | | | |
|---|---|---|---|---|---|---|
| Time period | Stage | Parameter | Process step time value (hr) | Hydrogen-containing total flow value (slpm) | Amount of inputted hydrogen (%) | Rotational speed (r/min) |
| T11 | material melting | temperature 1500° C | 8 | 110 | 0 | 3 |
| T12 | re-feeding | temperature 1500° C. | 7 | 110 | 0 | 6 |
| T13 | volatilization | temperature 1470° C. | 2 | 110 | 0 | 6 |
| T1 | fusion | high temperature preheating 1470° C. | 0.3 | 100 | 0 | 12 |
| T2 | | low temperature fusion 1450° C. | 2 | 100 | 0 | 12 |
| T3 | crystal seeding | 1450° C. | 1 | 100 | 0 | 12 |
| T4 | shoulder | shoulder length 0-75 mm | 1.2 | 100 | 5 | 12 |
| T5 | expansion | shoulder length 76 mm-149 mm | 0.9 | 100 | 5 | 10 |
| T6 | | shoulder length 150 mm-245 mm | 1 | 100 | 5 | 10 |
| T7 | Shoulder rotation | / | 0.2 | 100 | 5 | 10 |
| T8 | diameter | 0-500 mm | 7 | 100 | 15 | 10 |
| T9 | equalization | 500 mm-1500 mm | 12 | 100 | 10 | 8 |
| T10 | | 1500 mm-3500 mm | 20 | 100 | 10 | 8 |
| T11 | | 3500 mm-4500 mm | 12 | 100 | 10 | 8 |

Embodiment 3: the manufacturing method is different from the manufacturing method of embodiment 1, a difference is that a time period for inputting the hydrogen gas is changed, and specific parameters refer to Table 3.

TABLE 3

| | | | manufacturing parameters of the crystal rod of embodiment 3 | | | | |
|---|---|---|---|---|---|---|
| Time period | Stage | Parameter | Process step time value (hr) | Hydrogen-containing total flow value (slpm) | Amount of inputted hydrogen (%) | Rotational speed (r/min) |
| T11 | material melting | Temperature 1500° C. | 8 | 110 | 0 | 3 |
| T12 | re-feeding | Temperature 1500° C. | 7 | 110 | 0 | 6 |
| T13 | volatilization | Temperature 1470° C. | 2 | 110 | 0 | 6 |
| T1 | fusion | High temperature preheating 1470° C. | 0.3 | 100 | 0 | 12 |
| T2 | | Low temperature fusion 1450° C. | 2 | 100 | 0 | 12 |
| T3 | crystal seeding | 1450° C. | 1 | 100 | 0 | 12 |
| T4 | shoulder | shoulder length 0-75 mm | 1.2 | 100 | 0 | 12 |
| T5 | expansion | shoulder length 76 mm-149 mm | 0.9 | 100 | 0 | 10 |

TABLE 3-continued

| | | | | Hydrogen-containing | Amount of inputted | Rotational |
| Time period | Stage | Parameter | Process step time value (hr) | total flow value (slpm) | hydrogen (%) | speed (r/min) |
|---|---|---|---|---|---|---|
| T6 | | shoulder length 150 mm-245 mm | 1 | 100 | 0 | 10 |
| T7 | shoulder rotation | / | 0.2 | 100 | 5 | 10 |
| T8 | diameter | 0-500 mm | 7 | 100 | 15 | 10 |
| T9 | equalization | 500 mm-1500 mm | 12 | 100 | 10 | 8 |
| T10 | | 1500 mm-3500 mm | 20 | 100 | 10 | 8 |
| T11 | | 3500 mm-4500 mm | 12 | 100 | 10 | 8 |

Embodiment 4: the manufacturing method is different from the manufacturing method of embodiment 1, a difference is that a time period for inputting the hydrogen gas is changed, and specific parameters refers to Table 4.

Embodiment 6: the manufacturing method is the same as that in embodiment 1, and a difference is that both the first crucible rotational speed and the second crucible rotational speed are controlled to be 10 r/min.

TABLE 4 manufacturing parameters of the crystal rod of embodiment 4

| | | | | Hydrogen-containing | Amount of inputted | Rotational |
| Time period | Stage | Parameter | Process step time value (hr) | total flow value (slpm) | hydrogen (%) | speed (r/min) |
|---|---|---|---|---|---|---|
| T11 | material melting | temperature 1500° C. | 8 | 110 | 0 | 3 |
| T12 | re-feeding | temperature 1500° C. | 7 | 110 | 0 | 6 |
| T13 | volatilization | temperature 1470° C. | 2 | 110 | 0 | 6 |
| T1 | fusion | high temperature preheating 1470° C. | 0.3 | 100 | 0 | 12 |
| T2 | | low temperature fusion 1450° C. | 2 | 100 | 0 | 12 |
| T3 | crystal seeding | 1450° C. | 1 | 100 | 0 | 12 |
| T4 | shoulder | shoulder length 0-75 mm | 1.2 | 100 | 0 | 12 |
| T5 | expansion | shoulder length 76 mm-149 mm | 0.9 | 100 | 0 | 10 |
| T6 | | shoulder length 150 mm-245 mm | 1 | 100 | 0 | 10 |
| T7 | shoulder rotation | / | 0.2 | 100 | 0 | 10 |
| T8 | diameter | 0-500 mm | 7 | 100 | 15 | 10 |
| T9 | equalization | 500 mm-1500 mm | 12 | 100 | 10 | 8 |
| T10 | | 1500 mm-3500 mm | 20 | 100 | 10 | 8 |
| T11 | | 3500 mm-4500 mm | 12 | 100 | 10 | 8 |

Embodiment 5: the manufacturing method is different from the manufacturing method of embodiment 1, a difference is that parameters for inputting the hydrogen gas are changed, and specific parameters refer to Table 5.

Embodiment 7: the manufacturing method is the same as that in embodiment 1, and a difference is that during the shoulder expansion, in each of a stage of the shoulder length from 0 to 75 mm, a stage of the shoulder length from 76 mm

TABLE 5 manufacturing parameters of the crystal rod of embodiment 5

| | | | | Hydrogen-containing | Amount of inputted | Rotational |
| Time period | Stage | Parameter | Process step time value (hr) | total flow value (slpm) | hydrogen (%) | speed (r/min) |
|---|---|---|---|---|---|---|
| T11 | material melting | temperature 1500° C. | 8 | 110 | 10 | 3 |
| T12 | re-feeding | temperature 1500° C. | 7 | 110 | 5 | 6 |
| T13 | volatilization | temperature 1470° C. | 2 | 110 | 5 | 6 |
| T1 | Fusion | high temperature preheating 1470° C. | 0.3 | 100 | 5 | 12 |
| T2 | | low temperature fusion 1450° C. | 2 | 100 | 5 | 12 |
| T3 | crystal seeding | 1450° C. | 1 | 100 | 5 | 12 |
| T4 | shoulder | shoulder length 0-75 mm | 1.2 | 100 | 5 | 12 |
| T5 | expansion | shoulder length 76 mm-149 mm | 0.9 | 100 | 5 | 10 |
| T6 | | shoulder length 150 mm-245 mm | 1 | 100 | 5 | 10 |
| T7 | shoulder rotation | / | 0.2 | 100 | 5 | 10 |
| T8 | diameter | 0-500 mm | 7 | 100 | 10 | 10 |
| T9 | equalization | 500 mm-1500 mm | 12 | 100 | 5 | 8 |
| T10 | | 1500 mm-3500 mm | 20 | 100 | 5 | 8 |
| T11 | | 3500 mm-4500 mm | 12 | 100 | 5 | 8 | to 149 mm, and a stage of the shoulder length from 150 mm to 245 mm, a time length for the controlling process step is 1 hour and a time period for inputting the hydrogen-containing gas is controlled to be 1 hour.

Embodiment 8: the manufacturing method is the same as that in embodiment 1, and a difference is that during the diameter equalization, both the third crucible rotational speed and the fourth crucible rotational speed are controlled to be 8 r/min.

Embodiment 9: the manufacturing method is the same as that in embodiment 1, and a difference is that during the diameter equalization, when the crystal rod length is in a stage from 0 mm to 500 mm, a time length for the controlling process step is 9 hours, and a time period for inputting the hydrogen gas is 9 hours. When the crystal rod length is in a stage from 500 mm to 1500 mm, a time length for the controlling process step is 9 hours, a time period for inputting the hydrogen-containing gas is 9 hours. When the crystal rod length is in a stage from 1500 mm to 3500 mm, a time length for the controlling process step is 20 hours, a time period for inputting the hydrogen gas is 20 hours. When the crystal rod length is in a stage from 3500 mm to 4500 mm, a time length for the controlling process step is 9 hours, and a time period for inputting the hydrogen-containing gas is 9 hours.

Embodiment 10: the manufacturing method is the same as that in embodiment 4, and a difference is that during the diameter equalization, a content of the hydrogen gas in the hydrogen-containing gas inputted is 20%.

Comparative example 1: the manufacturing method is the same as that in embodiment 1, and a difference is that argon gas is inputted over the entire manufacturing method.

Performance test: Crystal rods manufactured by embodiments 1 to 10 and the comparative example 1 undergo a performance test, and a testing method thereof is as follows.

Resistivity test: a KDY-1A resistivity tester is utilized to test the resistivity of the crystal rod.

A testing method for oxygen of a head of the crystal rod: An oxygen content of the head of the crystal rod is tested, and a testing method thereof refers to GB/T 1557-2018, a Nicolet6700 Fourier transform infrared spectrometer is utilized to test the oxygen content in the crystal rod.

Lifetime test: A Sinton BLS-1 minority carrier lifetime tester is utilized to test the crystal rod minority carrier lifetime.

Carbon content testing method: A Nicolet6700 Fourier transform infrared spectrometer is utilized to test a carbon content in the crystal rod.

Defect testing method: A PL defect tester is utilized to test the crystal rod defect.

TABLE 6

| | Test result | | | | |
|---|---|---|---|---|---|
| | Head oxygen content (ppma) | Tail lifetime (μs) | Defect | Carbon content (ppma) | Head resistivity/Tail resistivity |
| Embodiment 1 | 6.7 | 425 | None | 2.7 | 2.4 |
| Embodiment 2 | 8.6 | 411 | None | 2.8 | 2.6 |
| Embodiment 3 | 10.5 | 398 | None | 2.8 | 2.8 |
| Embodiment 4 | 11.8 | 376 | None | 2.9 | 3.0 |
| Embodiment 5 | 12.4 | 350 | None | 2.9 | 3.1 |
| Embodiment 6 | 7.8 | 407 | None | 2.8 | 2.5 |
| Embodiment 7 | 7.5 | 403 | None | 2.8 | 2.8 |
| Embodiment 8 | 7.9 | 407 | None | 2.7 | 2.7 |
| Embodiment 9 | 7.2 | 410 | None | 2.7 | 3.0 |

TABLE 6-continued

| | Test result | | | | |
|---|---|---|---|---|---|
| | Head oxygen content (ppma) | Tail lifetime (μs) | Defect | Carbon content (ppma) | Head resistivity/Tail resistivity |
| Embodiment 10 | 7.7 | 406 | None | 2.7 | 2.9 |
| Comparative example 1 | 13.8 | 317 | A/B | 3.0 | 4.0 |

It can be known from the above result that the oxygen content in the crystal rod manufactured in the furnace platform inputted with hydrogen-containing gas of embodiment 1 to embodiment 10 is obviously lower than the oxygen content in the crystal rod manufactured in the furnace platform in the comparative example 1, which indicates that hydrogen reduction reaction occurs after gas input to lower the oxygen content concentration of the solid-liquid interface such that the oxygen content of the monocrystalline silicon is lowered. Also, the minority carrier lifetime and a number of pulling can be improved. Furthermore, the present application, inputting hydrogen-containing gas during the process of manufacturing the crystal rods, can reduce defects of the monocrystalline silicon.

It can be known from data of embodiment 1 to embodiment 10 that hydrogen is located at a bonding center of a B—Si bond in the p-type monocrystalline silicon doped with boron or gallium, a distance of hydrogen from boron or gallium is 0.135 nm, and a distance of hydrogen from silicon is 0.164 nm, which is obviously capable of forming a B/G-H bond. Theoretical calculations suggest that a stretching vibration of an infrared (IR) spectrum of B/G-H is 2031 $cm^{-1}$, an oscillatory vibration is 233 $cm^{-1}$, and experimental measurements indicate that the stretching vibration of B—H is 1903 $cm^{-1}$. When the boron or gallium concentration is relatively low, resulting in higher resistivity (10 Ω·cm-100 Ω·cm), boron or gallium forms complexes with either one or two hydrogen atoms. However, when the resistivity is low (0-0.1 Ω·cm), boron or gallium forms complexes with multiple hydrogen atoms (B—H8-12), weakening their role as acceptor impurities. The formation of H—B/G complexes, as a result of hydrogen impurities binding with boron or gallium, reduces the concentration of boron or gallium in the silicon, leading to an increase in resistivity. Other acceptor impurities, such as aluminum, phosphorus, indium, and so on, can also form complexes with hydrogen, resulting in an increase in resistivity. This process allows for the production of longer single crystal rods (silicon rods) and enhances the yield and quality of the products.

It can be understood from data of embodiments 1 to 10 that solutions of the present application can drastically lower a difference between the head resistivity and the tail resistivity of the crystal rod to improve an axial uniformity of the crystal rod.

Sources of minority carrier lifetime are mainly from hazardous metal elements in each stage. An influence of the low lifetime of the minority carrier: The conversion efficiency of the solar battery is directly influenced. The present application inputs hydrogen-containing gas during the process of manufacturing the crystal rods to improve the minority carrier lifetime.

In the above-mentioned embodiments, the descriptions of the various embodiments are focused. For the details of the embodiments not described, reference may be made to the related descriptions of the other embodiments.

The crystal rod manufacturing method and the crystal rod provided by the embodiment of the present application are described in detail as above. The principles and implementations of the present application are described in the following by using specific examples. The description of the above embodiments is only for assisting understanding of the technical solutions of the present application and the core ideas thereof. Those of ordinary skill in the art should understand that they can still modify the technical solutions described in the foregoing embodiments or equivalently replace some of the technical features. These modifications or replacements do not make the essence of the technical solutions depart from a range of the technical solutions of the embodiments of the present application.

What is claimed is:

1. A crystal rod manufacturing method, comprising: a shoulder rotation step and a diameter equalization step, wherein during the shoulder rotation step and/or the diameter equalization step, hydrogen-containing gas is inputted, the hydrogen-containing gas comprises hydrogen gas, a mass of the hydrogen gas is $m_H$, a total mass of the hydrogen-containing gas is $m_{total}$, and an inequation as follows is satisfied: $m_H/m_{total} \leq 30\%$;
   wherein the crystal rod manufacturing method further comprises a material melting step, a fusion step, a crystal seeding step, and a shoulder expansion step;
   wherein the hydrogen-containing gas is inputted in one or more of the material melting step, the fusion step, the crystal seeding step, and the shoulder expansion step;
   wherein the shoulder expansion step comprises expanding and growing a shoulder to a target shoulder length stage; and
   wherein in the shoulder expansion step, a shoulder length is $L_1$, a target shoulder length is $L$; in a stage of $0 < L_1 < 0.3L$, a first crucible rotational speed $V_1$ is controlled; in a stage of $0.3L < L_1 \leq L$, a second crucible rotational speed $V_2$ is controlled; and an inequation as follows is satisfied: $V_1 > V_2$.

2. The crystal rod manufacturing method according to claim 1, wherein the first crucible rotational speed $V_1$ ranges from 9 r/min (revolution per minute, RPM) to 15 r/min;
   and/or, the second crucible rotational speed $V_2$ ranges from 7 r/min to 12 r/min.

3. The crystal rod manufacturing method according to claim 1, wherein in the diameter equalization step, in a stage of $0 < H_1 \leq 0.11H$, a third crucible rotational speed $V_3$ is controlled; in a stage of $0.11H < H_1 \leq H$, a fourth crucible rotational speed $V_4$ is controlled, an inequation as follows is satisfied: $V_3 > V_4$, $H_1$ is a crystal pulling length, and H is a target crystal rod total length.

4. The crystal rod manufacturing method according to claim 1, wherein the diameter equalization step comprises a first diameter equalization stage, the first diameter equalization stage is: $0 < H_1 \leq 0.11H$, the hydrogen-containing gas is inputted in the first diameter equalization stage, $H_1$ is a crystal pulling length, and H is a target crystal rod total length.

5. The crystal rod manufacturing method according to claim 4, wherein the diameter equalization step comprises a second diameter equalization stage, a third diameter equalization stage, and a fourth diameter equalization stage; the second diameter equalization stage is a stage of $0.11H < H_1 \leq 0.33H$; the third diameter equalization stage is a stage of $0.33H < H_1 \leq 0.77H$, the fourth diameter equalization stage is a stage of $0.77H < H_1 \leq H$; and the hydrogen-containing gas is inputted in one or more of the second diameter equalization stage, the third diameter equalization stage, and the fourth diameter equalization stage.

6. The crystal rod manufacturing method according to claim 5, wherein in the first diameter equalization stage a time period for inputting the hydrogen-containing gas is $T_4$, in the second diameter equalization stage a time period for inputting the hydrogen-containing gas is $T_5$, in the third diameter equalization stage a time period for inputting the hydrogen-containing gas is $T_6$, in the fourth diameter equalization stage a time period for inputting the hydrogen-containing gas is $T_7$; and an inequation as follows is satisfied: $T_4 < T_5 = T_7 < T_6$;
   and/or, a hydrogen content of the hydrogen-containing gas in the first diameter equalization stage is greater than a hydrogen content of the hydrogen-containing gas in each of the second diameter equalization stage, the third diameter equalization stage, and the fourth diameter equalization stage.

7. The crystal rod manufacturing method according to claim 1, wherein
   the material melting step comprises a feeding step, a re-feeding step, and a volatilization step, and a temperature of the feeding step ranges from 300° C. to 1600° C.;
   and/or, a temperature of the re-feeding step ranges from 1400° C. to 1600° C.;
   and/or, a temperature of the volatilization step ranges from 1460° C. to 1480° C.

8. The crystal rod manufacturing method according to claim 7, wherein
   a time period for the feeding step ranges from 4 hours to 12 hours;
   and/or, a time period for the re-feeding step ranges from 3 hours to 10 hours;
   and/or, a time period for the volatilization step ranges from 0.3 hours to 3 hours.

9. The crystal rod manufacturing method according to claim 7, wherein the hydrogen-containing gas is inputted in the material melting step, and a hydrogen content of the hydrogen-containing gas is $\leq 30\%$;
   and/or, the hydrogen-containing gas is inputted in the feeding step, and a hydrogen content of the hydrogen-containing gas is $\leq 30\%$;
   and/or, the hydrogen-containing gas is inputted in the re-feeding step, and a hydrogen content of the hydrogen-containing gas is $\leq 20\%$; and the hydrogen-containing gas is inputted in the volatilization step, and a hydrogen content of the hydrogen-containing gas is $\leq 20\%$.

10. The crystal rod manufacturing method according to claim 1, wherein the fusion step comprises a high temperature preheating stage and a low temperature fusion stage; a temperature of the high temperature preheating stage ranges from 1457° C. to 1475° C., a temperature of the low temperature fusion stage ranges from 1449° C. to 1457° C.;
   and/or, a crucible rotational speed of the fusion step ranges from 6 r/min to 15 r/min;
   and/or, the hydrogen-containing gas is inputted in the fusion step, and a hydrogen content of the hydrogen-containing gas is $\leq 15\%$;
   and/or, a duration of the high temperature preheating stage ranges from 0.1 hours to 1 hour;
   and/or, a duration of the low temperature fusion stage ranges from 0.1 hours to 4 hours.

11. The crystal rod manufacturing method according to claim 1, wherein a content of boron and/or gallium in raw material for manufacturing the crystal rod ranges from 0.007 milligrams per gram (mg/g) to 0.8 mg/g; or a content of phosphorus in raw material for manufacturing the crystal rod ranges from 0.001 mg/g to 0.01 mg/g.

12. A crystal rod, obtained from the crystal rod manufacturing method according to claim 1.

13. A crystal rod manufacturing method, comprising: a shoulder rotation step and a diameter equalization step, wherein during the shoulder rotation step and/or the diameter equalization step, hydrogen-containing gas is inputted, the hydrogen-containing gas comprises hydrogen gas, a mass of the hydrogen gas is $m_H$, a total mass of the hydrogen-containing gas is $m_{total}$, and an inequation as follows is satisfied: $m_H/m_{total} \leq 30\%$;

wherein the crystal rod manufacturing method further comprises a material melting step, a fusion step, a crystal seeding step, and a shoulder expansion step;

wherein the hydrogen-containing gas is inputted in one or more of the material melting step, the fusion step, the crystal seeding step, and the shoulder expansion step;

wherein in the diameter equalization step, in a stage of $0 < H_1 \leq 0.11H$, a third crucible rotational speed $V_3$ is controlled; in a stage of $0.11H < H_1 \leq H$, a fourth crucible rotational speed $V_4$ is controlled, an inequation as follows is satisfied: $V_3 > V_4$, $H_1$ is a crystal pulling length, and H is a target crystal rod total length.

14. The crystal rod manufacturing method according to claim 13, wherein the shoulder expansion step comprises expanding and growing a shoulder to a target shoulder length stage; and in the shoulder expansion step, a shoulder length is $L_1$, a target shoulder length is L; in a stage of $0 < L_1 \leq 0.3L$, a first crucible rotational speed $V_1$ is controlled; in a stage of $0.3L < L_1 \leq L$, a second crucible rotational speed $V_2$ is controlled; and an inequation as follows is satisfied: $V_1 > V_2$.

15. The crystal rod manufacturing method according to claim 14, wherein the first crucible rotational speed $V_1$ ranges from 9 r/min (revolution per minute, RPM) to 15 r/min;

and/or, the second crucible rotational speed $V_2$ ranges from 7 r/min to 12 r/min.

16. The crystal rod manufacturing method according to claim 13, wherein in the shoulder expansion step, a shoulder length is $L_1$, a target shoulder length is L; in a stage of $0 < L_1 \leq 0.3L$, a time period for inputting the hydrogen-containing gas is $T_1$; in a stage of $0.3L < L_1 < 0.6L$, a time period for inputting the hydrogen-containing gas is $T_2$, in a stage of $0.6L < L_1 \leq L$, a time period for inputting the hydrogen-containing gas is $T_3$; in the shoulder expansion step, a total time period for inputting the hydrogen-containing gas is $T_{shoulder\ expansion}$, and $T_{shoulder\ expansion} = T_1 + T_2 + T_3$;

an inequation as follows is satisfied: $T_2 < T_1$;
and/or, an inequation as follows is satisfied: $T_2 < T_3$;
and/or, an inequation as follows is satisfied: $T_3 < T_1$.

17. The crystal rod manufacturing method according to claim 13, wherein the diameter equalization step comprises a first diameter equalization stage, the first diameter equalization stage is: $0 < H_1 \leq 0.11H$, the hydrogen-containing gas is inputted in the first diameter equalization stage.

18. A crystal rod manufacturing method, comprising: a shoulder rotation step and a diameter equalization step, wherein during the shoulder rotation step and/or the diameter equalization step, hydrogen-containing gas is inputted, the hydrogen-containing gas comprises hydrogen gas, a mass of the hydrogen gas is $m_H$, a total mass of the hydrogen-containing gas is $m_{total}$, and an inequation as follows is satisfied: $m_H/m_{total} \leq 30\%$;

wherein the crystal rod manufacturing method further comprises a material melting step, a fusion step, a crystal seeding step, and a shoulder expansion step;

wherein the hydrogen-containing gas is inputted in one or more of the material melting step, the fusion step, the crystal seeding step, and the shoulder expansion step;

in the shoulder expansion step, a shoulder length is $L_1$, a target shoulder length is L; in a stage of $0 < L_1 \leq 0.3L$, a time period for inputting the hydrogen-containing gas is $T_1$; in a stage of $0.3L < L_1 \leq 0.6L$, a time period for inputting the hydrogen-containing gas is $T_2$; in a stage of $0.6L < L_1 \leq L$, a time period for inputting the hydrogen-containing gas is $T_3$; in the shoulder expansion step, a total time period for inputting the hydrogen-containing gas is $T_{shoulder\ expansion}$, and $T_{shoulder\ expansion} = T_1 + T_2 + T_3$;

an inequation as follows is satisfied: $T_2 < T_1$;
and/or, an inequation as follows is satisfied: $T_2 < T_3$;
and/or, an inequation as follows is satisfied: $T_3 < T_1$.

19. The crystal rod manufacturing method according to claim 18, wherein the diameter equalization step comprises a first diameter equalization stage, the first diameter equalization stage is: $0 < H_1 \leq 0.11H$, the hydrogen-containing gas is inputted in the first diameter equalization stage, $H_1$ is a crystal pulling length, and H is a target crystal rod total length.

20. The crystal rod manufacturing method according to claim 19, wherein the diameter equalization step comprises a second diameter equalization stage, a third diameter equalization stage, and a fourth diameter equalization stage; the second diameter equalization stage is a stage of $0.11H < H_1 \leq 0.33H$; the third diameter equalization stage is a stage of $0.33H < H_1 \leq 0.77H$, the fourth diameter equalization stage is a stage of $0.77H < H_1 \leq H$; and the hydrogen-containing gas is inputted in one or more of the second diameter equalization stage, the third diameter equalization stage, and the fourth diameter equalization stage.

* * * * *